United States Patent
Tsai (10) Patent No.: US 11,139,362 B2
(45) Date of Patent: Oct. 5, 2021

(54) DISPLAY PANEL WITH ASYMMETRICALLY DISPOSED PADS

(71) Applicant: Wuhan China Star Optoelectronics Semiconductor Display Technology Co., LTD., Wuhan (CN)

(72) Inventor: Kunyueh Tsai, Wuhan (CN)

(73) Assignees: Wuhan China Star Optoelectronics, Wuhan (CN); Semiconductor Display Technology Co., LTD., Wuhan (CN)

(*) Notice: Subject to any disclaimer, the term of this patent is extended or adjusted under 35 U.S.C. 154(b) by 2 days.

(21) Appl. No.: 16/633,420

(22) PCT Filed: Nov. 13, 2019

(86) PCT No.: PCT/CN2019/011791
§ 371 (c)(1),
(2) Date: Jan. 23, 2020

(87) PCT Pub. No.: WO2021/012516
PCT Pub. Date: Jan. 28, 2021

(65) Prior Publication Data
US 2021/0028263 A1   Jan. 28, 2021

(30) Foreign Application Priority Data
Jul. 23, 2019 (CN) .......................... 201910664133.1

(51) Int. Cl.
*H01L 27/32* (2006.01)
*G09G 3/3225* (2016.01)

(52) U.S. Cl.
CPC ....... *H01L 27/3276* (2013.01); *G09G 3/3225* (2013.01)

(58) Field of Classification Search
CPC .......................... H01L 27/3276; G09G 3/3225
See application file for complete search history.

(56) References Cited

U.S. PATENT DOCUMENTS

| | | | | |
|---|---|---|---|---|
| 5,951,304 A | * | 9/1999 | Wildes | B81B 7/0006 439/67 |
| 9,894,792 B2 | * | 2/2018 | Bae | H05K 7/06 |
| 10,034,367 B2 | * | 7/2018 | Park | H01L 25/167 |
| 10,451,932 B2 | * | 10/2019 | Chen | H01L 23/4985 |

(Continued)

FOREIGN PATENT DOCUMENTS

| | | |
|---|---|---|
| CN | 109521611 A | 3/2019 |
| CN | 109860248 A | 6/2019 |
| KR | 20150054454 A | 5/2015 |

*Primary Examiner* — Lex H Malsawma
(74) *Attorney, Agent, or Firm* — Neugeboren O'Dowd PC (57) ABSTRACT

The present invention provides a display panel, including a display area, a binding area and a pad area located between the display area and the binding area. The display area is provided with a function layer, the binding area is provided with a driving unit, and the pad area provided with a plurality of pads arranged in multiple rows and multiple columns. One end of each of the pads is connected to the function layer, and the other end of each of the pads is connected to the driving unit, wherein the plurality of the pads are disposed asymmetrically with respect to the centerline, and the centerline is a centerline of the display panel running through the display area, the pad area, and the binding area.

5 Claims, 4 Drawing Sheets

(56) References Cited

U.S. PATENT DOCUMENTS

| | | | |
|---|---|---|---|
| 10,897,819 B2* | 1/2021 | Wu | H05K 1/118 |
| 2015/0103500 A1* | 4/2015 | Bae | H01L 24/06 |
| | | | 361/749 |
| 2015/0366049 A1* | 12/2015 | Lee | H01L 27/124 |
| | | | 361/749 |
| 2018/0047314 A1* | 2/2018 | Chen | H01L 21/77 |
| 2018/0059449 A1* | 3/2018 | Kim | G02F 1/1309 |
| 2018/0061306 A1* | 3/2018 | Eom | G09G 3/2092 |
| 2019/0198473 A1* | 6/2019 | Li | H01L 24/13 |
| 2019/0326274 A1* | 10/2019 | Lee | H01L 24/14 |

* cited by examiner

DISPLAY PANEL WITH ASYMMETRICALLY DISPOSED PADS

CROSS REFERENCE

The application claims the priority of International Application No. PCT/CN2019/117913, filed on Nov. 13, 2019, titled "DISPLAY PANEL", which claims priority to Chinese Application NO. 201910664133.1, filled on Jul. 23, 2019. The entire disclosures of each of the applications are incorporated herein by reference.

FIELD OF INVENTION

The invention relates to a field of display technology, and more particularly to a display panel.

BACKGROUND OF INVENTION

Full-screen mobile phones are getting more and more popular. Screens with a high screen-to-body ratio become more and more popular. The so-called screen-to-body ratio is a ratio of a screen area to an area of whole mobile phone. Higher screen-to-body ratio may give user a better visual experience. The display effect of the full-screen display performs better with a higher screen-to-body ratio. Therefore, the full-screen display has favorited by more and more consumers and has become an inventible trend of the development of the mobile phone and other electronic devices in the future.

An active-matrix organic light emitting diode (AMOLED) display is a more widely-used display panel than others. There are a plurality of pads in the display panel, and the pads are located in a non-display area and are configured to connect to routing and driving circuit units. When the flexible AMOLED display panel is bent, the region where the pads are located is bent to the back of the display panel, thereby reducing the borders of the display panel. However, a large amount of space is occupied by the routing that the existing pads are connected to the display area, it is not conductive to narrow the borders of products.

Therefore, it needs to provide a new display panel to resolve the problems.

SUMMARY OF INVENTION

The present invention provides a display panel which is able to reduce the routing area, reduce the width of the boarder of the display panel and improve the screen-to-body ratio.

In order to resolve the problems, the present invention provides the technical solution as follows:

The embodiment of the present invention provides a display panel, comprising a display area, a binding area and a pad area located between the display area and the binding area, the display area provided with a function layer, the binding area provided with a driving unit, wherein the pad area provided with a plurality of pads arranged in multiple rows and multiple columns, one end of each of the pads is connected to the function layer, the other end of each of the pads is connected to the driving unit, wherein the plurality of pads are disposed asymmetrically with respect to a centerline, and the centerline is a centerline of the display panel running through the display area, the pad area and the binding area.

In the display panel provided by the embodiment of the present application, extension directions of the pads in a same column are same, extension lines of the pads in multiple columns intersect with the centerline.

In the display panel provided by the embodiment of the present application, the pads in multiple columns are disposed symmetrically with respect to the centerline, extension lines of any two columns of the pads disposed symmetrically are intersected at a same point on the centerline.

In the display panel provided by the embodiment of the present application, the centerline divides the symmetrically-disposed pads into a first pad group and a second pad group located at two sides of the centerline, wherein multiple columns of the pads in the first pad group are disposed in parallel with a same pitch, and wherein multiple columns of the pads in the second pad group are disposed in parallel with a same pitch.

In the display panel provided by the embodiment of the present application, the centerline divides the plurality of pads into a first pad group and a second pad group located at two sides of the centerline, extension lines of multiple columns of the pads in the first pad group converge at a first point, extension lines of multiple columns of the pads in the second pad group converge at a second point, both of the first point and the second point are located on the centerline.

In the display panel provided by the embodiment of the present application, the first point is different from the second point.

In the display panel provided by the embodiment of the present application, angles between the extension lines of the multiple columns of the pads in the first pad group and the centerline gradually decrease along a row direction of the first pad group toward the centerline, and wherein angles between the extension lines of the multiple columns of the pads in the second pad group and the centerline gradually decrease along a row direction of the second pad group toward the centerline.

In the display panel provided by the embodiment of the present application, the angles between the extension lines of the multiple columns of the pads in the first pad group and the centerline uniformly decrease along the row direction of the first pad group toward the centerline, and wherein the angles between the extension lines of the multiple columns of the pads in the second pad group and the centerline uniformly decrease along the row direction of the second pad group toward the centerline.

In the display panel provided by the embodiment of the present application, one column of the pads located at an edge of the pad area and the centerline are parallel to each other.

In the display panel provided by the embodiment of the present application, two columns of the pads located at edges of two sides of the pad area are disposed asymmetrically with respect to the centerline.

The beneficial effect of the present invention is that the display panel provided by the embodiment of the present invention comprises a display area, a binding area and a pad area located between the display area and the binding area, the display area provided with a function layer, the binding area provided with a driving unit, wherein the pad area provided with a plurality of pads arranged in multiple rows and multiple columns, one end of each of the pads is connected to the function layer, the other end of each of the pads is connected to the driving unit, wherein the plurality of pads are disposed asymmetrically with respect to a centerline, and the centerline is a centerline of the display panel running through the display area, the pad area and the binding area. The display panel of the present invention greatly optimizes the arrangement space of the pads to reduce the edge width of the display panel by arranging the pads in multiple rows and multiple columns, it can increase the screen-to-body ratio of the display panel. Furthermore, each of pitches between columns of the pads is the same, it can optimize the way of the routing between the pads to reduce the routing length that the pads are connected to the display area, and increase the stability of the driving signal to improve the display effect of the display panel simultaneously.

DESCRIPTION OF DRAWINGS

In order to clearly illustrate embodiments or technical solution in the prior art, a brief description of drawings used in the embodiments or the description of the prior art would be given as below. Obviously, the drawings in the following description are merely some embodiments of the invention. For persons skilled in this art, other drawings can be obtained from these drawings under the premise of the creative labor without paying.

DETAILED DESCRIPTION OF PREFERRED EMBODIMENTS

The following descriptions for the respective embodiments are specific embodiments capable of being implemented for illustrating the present disclosure with referring to the appending figures. In describing the present disclosure, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present disclosure for ease of understanding, but are not intended to limit the present disclosure. In the appending figures, units with similar structures are indicated by same reference numbers.

Figure 1:
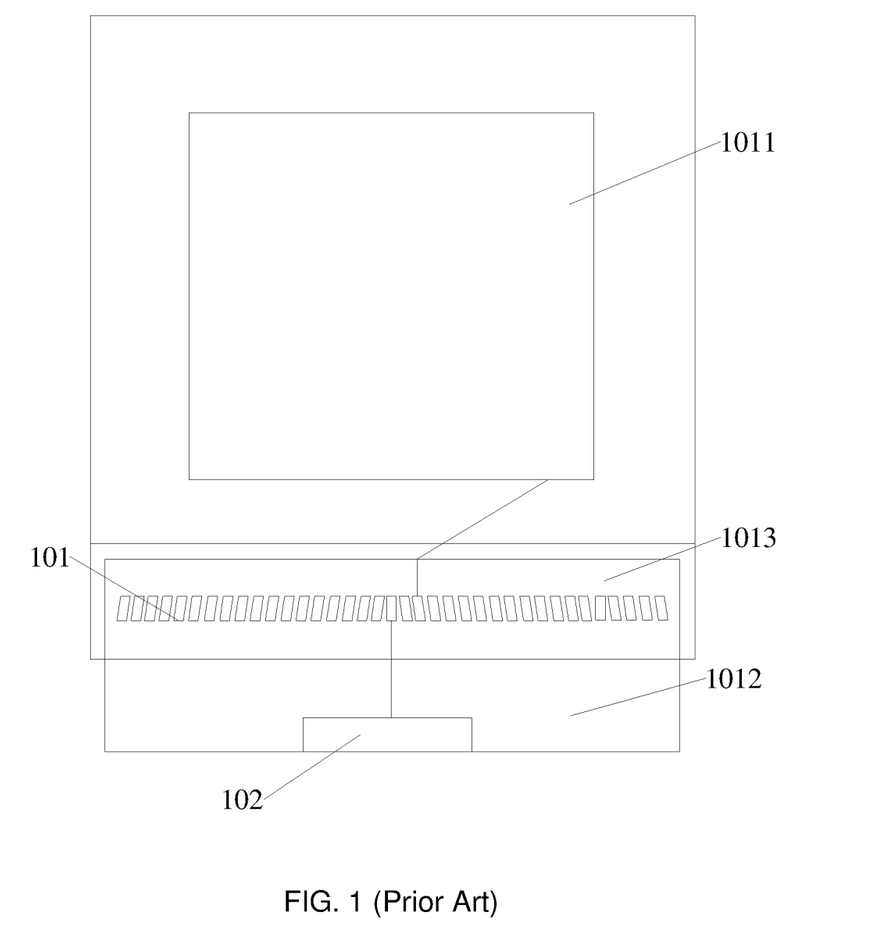
FIG. 1 is a schematic structural diagram showing an existing display panel.

FIG. 1 is a schematic structural diagram showing an existing display panel. In the existing display panel, a display area 1011 and a binding are connected through a pad area 1013. The display area 1011 includes a plurality of pixel units, the binding area is provided with a driving unit 102, which issues a driving signal. The driving signal is submitted along the routing to the pixel units of the display area 1011 by pads 101 in the pad area 1013 to realize the display of the display panel, wherein the pads 101 in the pad area 1013 are arranged in a row. However, when the driving unit 102 drives the display area 101 for a luminance display, the number of required pads 101 is large. If the pads 101 are arranged in a row, the edge of the display panel needs to be reserved with a larger width, so that the routing between the pads 101 and the display area 101 can be accommodated. This is not conductive to a narrow border of the display panel, and the screen-to-body ratio cannot be met with the demand.

For the existing display panel, because of the large number of the pads and the long routing length that is connected to the display area, resulting in the technical problem that is not conductive to narrow boarder due to a large width of the edge of the display panel. The embodiment of the present invention is able to resolve the drawback.

Figure 2:
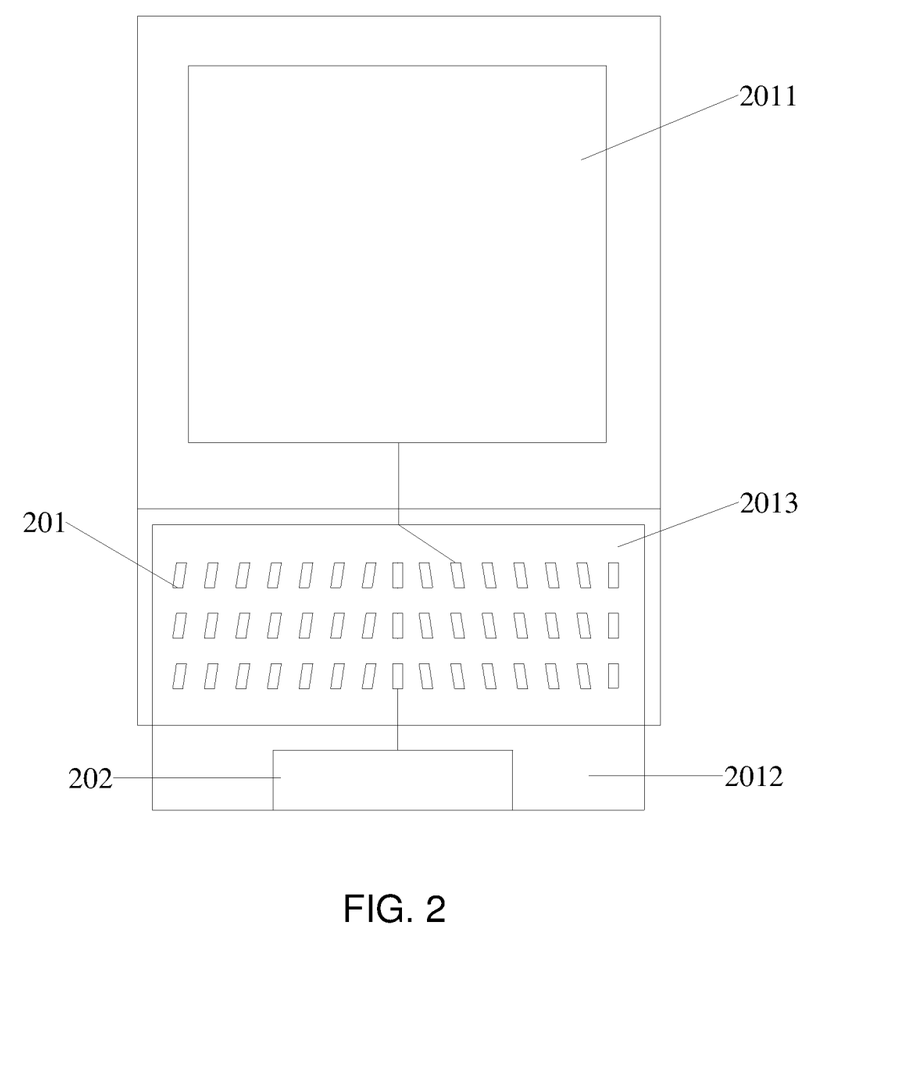
FIG. 2 is a schematic structural diagram showing a display panel in accordance with the embodiment of the present invention.

FIG. 2 is a schematic structural diagram showing a display panel in accordance with the embodiment of the present invention. The embodiment of the present invention provides a display panel including a display area 2011, a binding area 2012 and a pad area 2013 connected to the display area 2011 and the binding area 2012. The display area 2011 is provided with a function layer (not shown), the binding area 2012 is provided with a driving unit 202, and the pad area 2013 is provided with a plurality of pads 201 arranged in multiple rows and multiple columns. One end of each of the pads 201 is connected to the function layer, and the other end of each of the pads 201 is connected to the driving unit 202. The plurality of pads are disposed asymmetrically with respect to a centerline, wherein the centerline is a centerline of the display panel running through the display area, the pad area and the binding area. The pads 201 arranged in multiple columns can transmit a driving signal of the driving unit 202 to the display area 2011, and optimize the arrangement space of the pads 201 to reduce the routing that the pads 201 are connected to the display area 2011. The routing space is reduced to reduce the edge width of the display panel and increase the screen-to-body ratio.

Specifically, the display panel includes a flexible substrate, the pads in the pad area are disposed on the flexible substrate. The flexible substrate may be a flexible array substrate, for example, the flexible substrate is formed by a flexible substratum and a multi-function layer disposed on the flexible substratum. The flexible substratum includes, but is not limited to, a polyimide and others. The function layer includes, but is not limited to, a thin-film transistor layer. The function layer is connected with a plurality of metal routings, such as data lines, scan lines, and the like. One end of the pads is connected to the metal routings of the function layer.

Further, the display area includes a plurality of pixel units. The pixel units are arranged in a matrix, and each of the pixel units includes three sub-pixels R, G, B to respectively display in red, green and blue. The driving unit may be installed on the flexible substrate in a form of a chip. The driving unit outputs a data signal, and the data signal is transmitted to the pixel units by the pads to drive the pixel units to display different colors and achieve high resolution display.

It needs to be pointed out that the pads are connected with the driving unit by signal lines, and the signal line may be the metal routing. The conductive adhesive may be disposed between the pads and the driving unit. The pads and the driving unit are conducted by the conductive adhesive which may be an anisotropic conductive adhesive.

The arrangement of the pads in the pad area will be describe in detail below with multiple drawings and embodiments.

Figure 3:
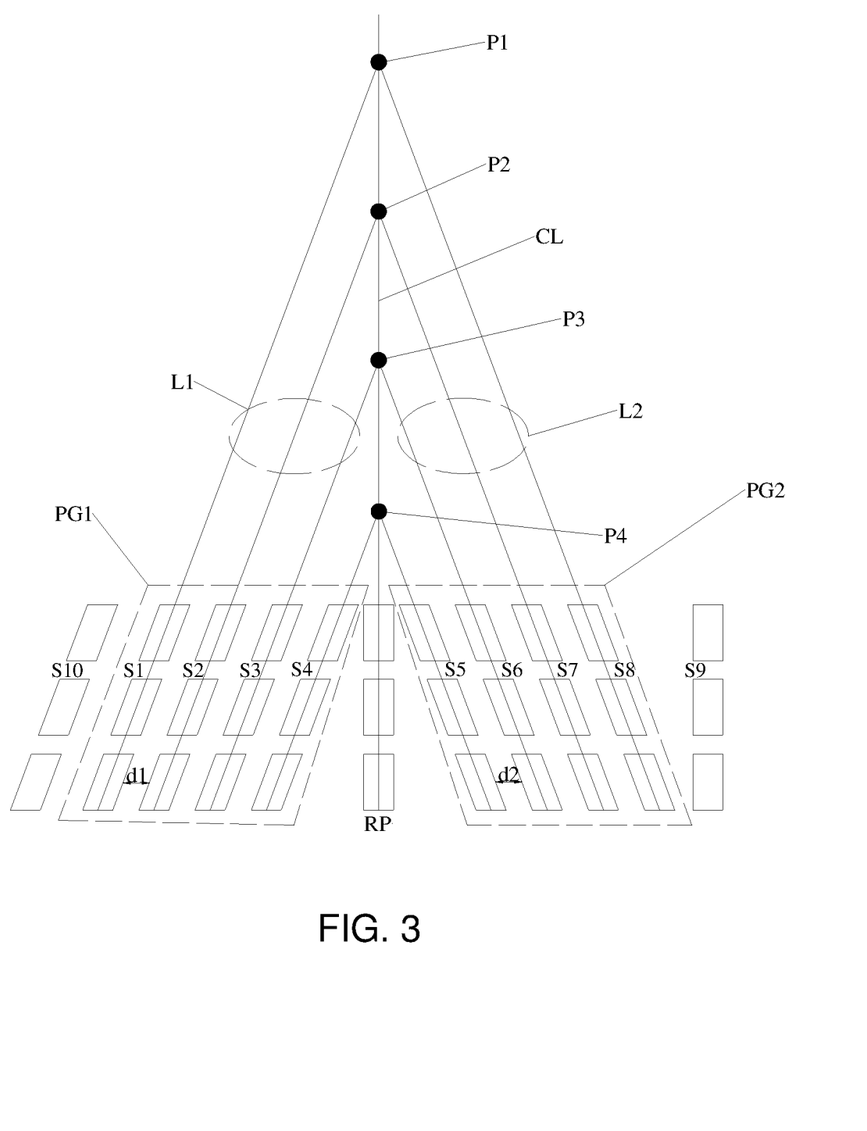
FIG. 3 is a schematic planar diagram showing an arrangement of pads in the display panel in accordance with the first embodiment of the present invention.

FIG. 3 is a schematic planar diagram showing an arrangement of pads in the display panel in accordance with the first embodiment of the present invention. In the display panel provided by the first embodiment of the present invention, extension directions of pads in a same column are the same. Extension lines of pads in multiple columns intersect with the centerline CL, and the centerline CL is a centerline of the display panel running through the display area, the pad area, and the binding area. That is, the pads in multiple columns incline toward the centerline CL.

Specifically, the pads in multiple columns are disposed symmetrically with respect to the centerline CL. Extension lines of any two columns of the pads disposed symmetrically are intersected at a same point on the centerline CL, and the distance between each of two columns of the pads disposed symmetrically and the centerline CL is equal to the other.

Further, the centerline CL divides the symmetrically-disposed pads into a first pad group PG1 and a second pad group PG2 located at two sides of the centerline CL. The number of the pads in the first pad group PG1 may or may not equal to the number of the pads in the second pad group PG2. Multiple columns of the pads in the first pad group PG1 are disposed in parallel with a same pitch, and a first distance d1 is provided between adjacent two columns of the pads in the first pad group PG1. Multiple columns of the pads in the second pad group PG2 are disposed in parallel with a same pitch, and a second distance d2 is provided between adjacent two columns of the pads in the second pad group PG2.

Each of columns of the pads in the first pad group PG1 has an extension line L1, and each of columns of the pads in the second pad group PG2 has an extension line L2. The pads in each of columns overlap with the corresponding extension line and are extendedly arranged in parallel. The first extension line L1 and the second extension line L2 intersect with multiple points on the centerline CL, and the distance between any two points is the same. That is, the first distance d1 is equal to the second distance d2.

In the present embodiment, an extension line of one column of the pads located at an edge of the pad area and the centerline CL may be parallel to each other. That is, two columns of the pads located at the leftmost and the rightmost sides of the centerline CL are disposed asymmetrically with respect to the centerline CL. The routing of one column of the pads located at the leftmost or the rightmost side of the centerline CL is directly connected to a function layer of the display area to make the routing space can be greatly optimized without passing through the routing space.

In the present embodiment, each of pitches between columns of the pads is the same, so that the way of the routing arrangement between the pads can be greatly optimized. For example, in the figure, S1, S2, S3 and S4 are four columns of the pads in the first pad group PG1, and S5, S6, S7 and S8 are four columns of the pads in the second pad group PG2. Pitches between adjacent two columns of S1, S2, S3 and S4 are the same, pitches between adjacent two columns of S5, S6, S7 and S8 are the same. S1 and S8 are disposed symmetrically, the extension line L1 of S1 and the extension line of S8 intersect with the centerline CL, and the intersection point is P1. S2 and S7 are disposed symmetrically, the extension line L1 of S2 and the extension line of S7 intersect with the centerline CL, and the intersection point is P2. S3 and S6 are disposed symmetrically, the extension line L1 of S3 and the extension line of S6 intersect with the centerline CL, and the intersection point is P3. S4 and S5 are disposed symmetrically, the extension line L1 of S4 and the extension line of S5 intersect with the centerline CL, and the intersection point is P4, wherein P1, P2, P3 and P4 are arranged in a same pitch between each other.

Besides, the centerline CL is provided with one column of the pads RP, one column of the pads S9 near the pad area is parallel to the centerline CL. One column of the pads S10 located at an edge of the other side of the pad area and S9 are disposed asymmetrically with respect to the centerline CL, and a tilt angle of S10 may be the same as the tilt angle of S1, or different from the tilt angle of S1. It's sufficient that the angle between the extension line of S10 and the centerline CL is an acute angle. It needs to be pointed out that in others embodiments, S10 may be parallel to the centerline CL, and an angle is provided between the extension line of S9 and the centerline CL.

In the present embodiment, S9 is parallel the centerline CL. The routing of S9 is directly connected to the function layer of the display area to make the routing space can be greatly optimized without passing through the routing space, and the distance of the routing between the pads in each of columns is widened. When all the extension lines of the pads in each of columns need to converge to the centerline, the routing length that each of columns of the pads is connected to the display area decrease, and S1, S2, S3 and S4 are parallel to each other, as well as S5, S6, S7 and S8 are parallel to each other. When the conductive adhesive is laid, the pads and the driving unit can be better conducted to increase the ability of the driving signal.

In the present embodiment, the pads are arranged in three rows and ten columns. However, it should be clarified that in other embodiments, the pads may be arranged in four rows and ten columns, five rows and nine columns, and the like. It's sufficient that the pads only need to be arranged in multiple rows and multiple columns.

In the display panel provided by the first embodiment of the present invention, the pads are arranged in multiple rows and multiple columns. Multiple columns of the pads are disposed symmetrically with respect to the centerline, and the centerline divides the symmetrically-disposed pads into two groups of the pads located at two sides of the centerline. Each of pitches between columns of the pads in each of groups is the same, the routing distance between the pads in each of columns is widened, and the routing length that the pads are connected to the display area decrease. It can reduce the edge width of the display panel, increase the screen-to-body ratio, and increase the stability of the driving signal to improve the display effect of the display panel simultaneously.

Figure 4:
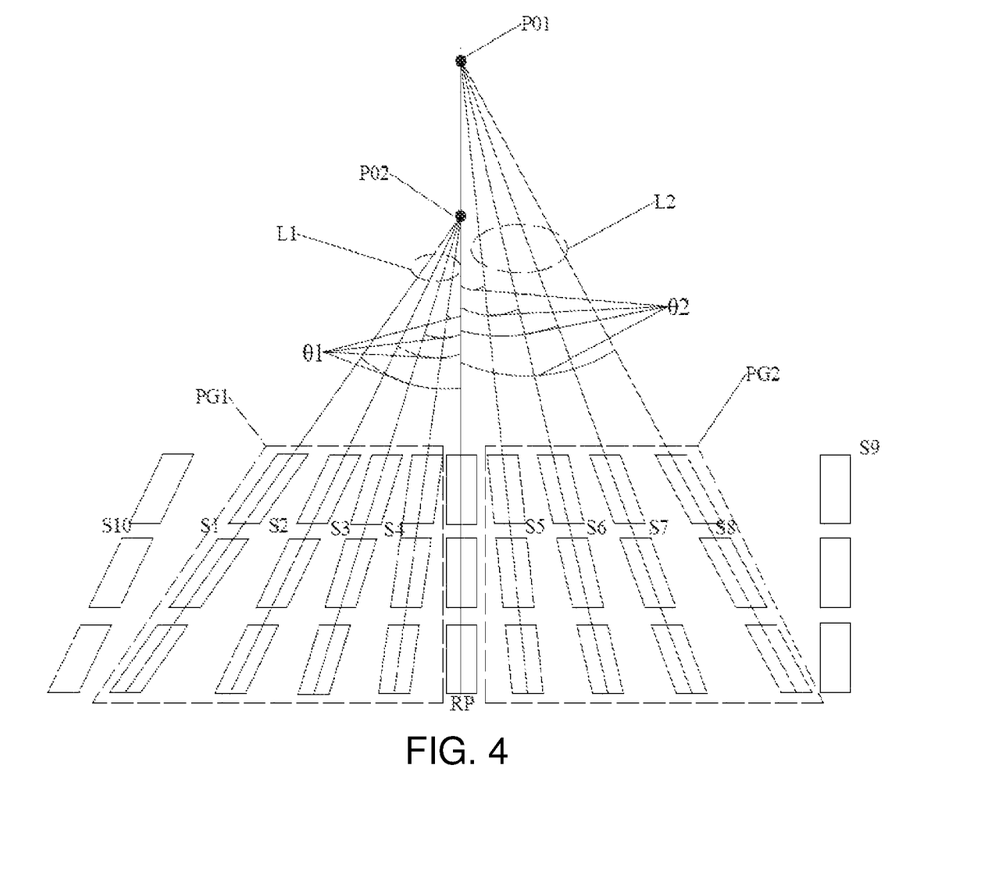
FIG. 4 is a schematic planar diagram showing an arrangement of pads in the display panel in accordance with the second embodiment of the present invention.

FIG. 4 is a schematic planar diagram showing an arrangement of pads in the display panel in accordance with the second embodiment of the present invention. In the display panel provided by the first embodiment of the present invention, extension directions of pads in a same column are the same. Extension lines of pads in multiple columns intersect with the centerline CL, and the centerline CL is a centerline of the display panel running through the display area, the pad area, and the binding area. That is, the pads in multiple columns incline toward the centerline CL.

The centerline CL divides the plurality of pads into a first pad group PG1 and a second pad group located at two sides of the centerline CL.

Multiple columns of the pads in the first pad group PG1 has extension line L1 which intersects at a first point P01, and multiple columns of the pads in the second pad group PG has extension line L2 which intersects at a second point P02. Both the first point P01 and the second point P02 are located on the centerline CL.

Specifically, there is a first angle $\theta1$ between the first extension line L1 and the centerline CL along a row direction of the first pad group PG1 toward the centerline CL. The first angle $\theta1$ gradually decrease. That is, the first extension line L1 gradually develop to parallel to the centerline CL. Each of columns of the pads in the first pad group PG1 should be aligned with each other in a row direction. There is a second angle $\theta2$ between the second extension line L2 and the centerline CL along a row direction of the second pad group PG2 toward the centerline CL. The second angle θ2 gradually decrease. That is, the second extension line L2 gradually develop to parallel to the centerline CL. Each of columns of the pads in the second pad group PG2 should be aligned with each other in a row direction.

Further, the first angle θ1 uniformly decrease, the second angle θ2 uniformly decrease, and each of pitches between center points of columns of the pads in the first pad group PG1 is the same, and each of pitches between center points of columns of the pads in the second pad group PG2 is the same.

In the present embodiment, an extension line of one column of the pads located at an edge of the pad area and the centerline CL may be parallel to each other. That is, two columns of the pads located at the leftmost and the rightmost sides of the centerline CL are disposed asymmetrically with respect to the centerline CL. The routing of one column of the pads located at the leftmost or the rightmost side of the centerline CL is directly connected to a function layer of the display area to make the routing space can be greatly optimized without passing through the routing space.

In the present embodiment, the first point P01 and the second point P02 may be the same point, and the first pad group PG1 and the second pad group PG2 are disposed symmetrically with respect to the centerline. The two columns of the pads located at two sides of the centerline CL with the same distance from the centerline CL are disposed symmetrically. That is, the reductive value of the first angle θ1 and the second angle θ 2 are the same. The first point P01 and the second point P02 may be the different point, and the reductive value of the first angle θ1 and the second angle θ 2 are different.

Taking the first point P01 and the second point P02 are the different points as an example, for example, in the figure, S1, S2, S3 and S4 are four columns of the pads in the first pad group PG1, and S5, S6, S7 and S8 are four columns of the pads in the second pad group PG2. S1, S2, S3 and S4 have an extension line L1, which intersects with the centerline CL, and the intersection point is a first point P01. S5, S6, S7 and S8 have an second extension line L2, which intersects with the centerline CL, and the intersection point is a second point P02. It needs to be pointed out that P01 can be above P02, or below P02. Pitches between S1, S2, S3 and S4 may be, or may be not, the same, and pitches between S4, S5, S6, and S7 may be, or may be not, the same. S1, S2, S3 and S4 incline toward the centerline CL in a same direction. There is a first angle θ1 between the first extension line L1 and the centerline CL, and the first angle θ1 decreases in the order of S1 to S4. Preferably, the first angle θ1 uniformly decreases in the order of S1 to S4. That is, angles between S1 and S2, S2 and S3, S3 and S4 are the same. Accordingly, S5, S6, S7 and S8 incline toward the centerline CL in the same direction. There is a second angle θ2 between the second extension line L2 and the centerline CL, and the second angle θ2 decreases in the order of S8 to S5. Preferably, the second angle θ2 uniformly decreases in the order of S8 to S5. That is, angles between S5 and S6, S6 and S7, S7 and S8 are the same.

Besides, the centerline CL is provided with one column of the pads RP, one column of the pads S9 near the pad area is parallel to the centerline CL. One column of the pads S10 located at an edge of the other side of the pad area and S9 are disposed asymmetrically with respect to the centerline CL, and a tilt angle of S10 may be the same as the tilt angle of S1 or S2 or S3 or S4. It's sufficient that the angle between the extension line of S10 and the centerline CL is an acute angle. It needs to be pointed out that in others embodiments, S10 may be parallel to the centerline CL, and an acute angle is provided between the extension line of S9 and the centerline CL.

In the present embodiment, S9 is parallel to the centerline CL, and the routing of S9 is directly connected to a function layer of the display area to make the routing space can be greatly optimized without passing through the routing space.

In the present embodiment, the pads are arranged in three rows and ten columns. However, it should be clarified that in other embodiments, the pads may be arranged in four rows and ten columns, five rows and nine columns, and the like. It's sufficient that the pads only need to be arranged in multiple rows and multiple columns.

In the display panel provided by the second embodiment of the present invention, the pads are divided into two pad groups located at two sides of the centerline. Each of extension lines of groups of the pads is intersected with the centerline, and each of extension lines of columns of the pads in the same group is intersected at the same point. Multiple columns of the pads in each of groups are disposed with a certain angle toward a direction that is parallel to the centerline CL. It can effectively optimize the arrangement of the pads, reduce the width of the edge of the display panel, and improve the screen-to-body ratio.

The beneficial effect of the present invention is that the display panel provided by the embodiments of the present invention includes a display area, a binding area, and a pad area located between the display area and the binding area. The display area is provided with a function layer, the binding area is provided with a driving unit, and the pad area is provided with a plurality of pads arranged in multiple rows and multiple columns. One end of each of the pads is connected to the function layer, the other end of each of the pads is connected to the driving unit. The plurality of pads are disposed asymmetrically, and the centerline is a centerline of the display panel running through the display area, the pad area, and the binding area. The display panel of the present invention greatly optimizes the arrangement space of the pads and reduces the width of the edge of the display panel by arranging the pads in multiple rows and multiple columns. It can increase the screen-to-body ratio of the display panel. Furthermore, each of pitches between columns of the pads is the same, it can optimize the way of the routing between the pads to reduce the routing length that the pads are connected to the display area, and increase the stability of the driving signal to improve the display effect of the display panel simultaneously.

The display panel provided by the embodiment of the present invention is described in detail above. It should be understood that the exemplary embodiments described herein should only be considered as descriptive to be used to assist in the understanding of the approach of the present invention and its core ideas. It is not used to limit the present invention.

What is claimed is:

1. A display panel, comprising a display area, a binding area and a pad area located between the display area and the binding area, the display area provided with a function layer, the binding area provided with a driving unit, wherein the pad area provided with a plurality of pads arranged in multiple rows and multiple columns, one end of each of the pads is connected to the function layer, the other end of each of the pads is connected to the driving unit, wherein the plurality of pads are disposed asymmetrically with respect to a centerline, and the centerline is a centerline of the display panel running through the display area, the pad area and the binding area, wherein extension directions of the pads in a same column are the same, extension lines of the pads in multiple columns intersect with the centerline, wherein the centerline divides the plurality of pads into a first pad group and a second pad group with respect to the centerline, extension lines of multiple columns of the pads in the first pad group converge at a first point, extension lines of multiple columns of the pads in the second pad group converge at a second point, both of the first point and the second point are located on the centerline, and wherein the first point is different from the second point.

2. The display panel as claimed in claim 1, wherein angles between the extension lines of the multiple columns of the pads in the first pad group and the centerline gradually decrease along a row direction of the first pad group toward the centerline, and wherein angles between the extension lines of the multiple columns of the pads in the second pad group and the centerline gradually decrease along a row direction of the second pad group toward the centerline.

3. The display panel as claimed in claim 2, wherein the angles between the extension lines of the multiple columns of the pads in the first pad group and the centerline uniformly decrease along the row direction of the first pad group toward the centerline, and wherein the angles between the extension lines of the multiple columns of the pads in the second pad group and the centerline uniformly decrease along the row direction of the second pad group toward the centerline.

4. The display panel as claimed in claim 1, wherein the pad area further comprises one column of the pads located at an edge of one side of the pad area and parallel to the centerline.

5. The display panel as claimed in claim 1, wherein the pad area further comprises two columns of the pads located at outermost edges of two sides of the pad area and disposed asymmetrically with respect to the centerline.

\* \* \* \* \*